United States Patent [19]
Nix

[11] Patent Number: 5,764,581
[45] Date of Patent: Jun. 9, 1998

[54] DYNAMIC RAM WITH TWO-TRANSISTOR CELL

[75] Inventor: Michael A. Nix, Buda, Tex.

[73] Assignee: Advanced Micro Devices Inc., Sunnyvale, Calif.

[21] Appl. No.: 812,931

[22] Filed: Mar. 4, 1997

[51] Int. Cl.$^6$ .............................. G11C 11/419; H03F 3/45
[52] U.S. Cl. ........................ 365/210; 365/207; 365/205; 365/230.03
[58] Field of Search ........................... 365/149, 200, 365/210, 201, 207, 205, 230.05, 230.01

[56] References Cited

U.S. PATENT DOCUMENTS

| | | | |
|---|---|---|---|
| 4,813,023 | 3/1989 | Brunolli | 365/207 |
| 5,298,815 | 3/1994 | Brunolli | 307/530 |
| 5,325,001 | 6/1994 | Brunolli | 307/530 |
| 5,568,434 | 10/1996 | Leon | 365/201 |
| 5,574,681 | 11/1996 | Foss et al. | 365/149 |
| 5,680,364 | 10/1997 | Lee | 365/230.05 |

*Primary Examiner*—Viet Q. Nguyen
*Attorney, Agent, or Firm*—Foley & Lardner

[57] ABSTRACT

A dynamic RAM having two-transistor memory cells includes a top array of memory cells and a bottom array of memory cells, with a sense amplifier disposed between the two halves. The memory cells in each column of the top half are coupled to respective Bit_Plus lines, and the memory cells in each column of the bottom half are coupled to respective Bit_Minus lines. The Bit_Plus lines and the Bit_Minus lines are respectively coupled to Plus and Minus inputs of sense amplifiers for each column. One row of the top array includes only dummy cells, and one row of the bottom array includes only dummy cells. When a memory cell in the top array is read, a dummy cell in the lower array is activated, and when a memory cell in the bottom array is read, a dummy cell in the upper array is activated. That way, a two-transistor memory cell array can have a dual-differential bit line feature in order to reduce errors due to noise.

20 Claims, 8 Drawing Sheets

DYNAMIC RAM WITH TWO-TRANSISTOR CELL

BACKGROUND OF THE INVENTION

1. Field of the Invention

The present invention relates to a dynamic RAM with two-transistor memory-cells and a single bit-line. In particular, the present invention relates to a dynamic RAM with two-transistor memory-cells, in which the memory is divided into a lower half and an upper half, with a dummy-memory-cell in each half.

2. Description of the Related Art

Two-transistor-memory-cell dynamic RAMs are used because of their small size. Two-transistor-memory-cells utilize a single bit-line for writing data to the memory-cells or for reading data from the memory-cells. Four-transistor or six-transistor-memory-cell dynamic RAMs utilize a pair of differential bit-lines, such as in the manner described in U.S. Pat. Nos. 4,813,023 and 5,298,815, both issued to M. Brunolli, and both of which are incorporated herein by reference.

Although a four-transistor or six-transistor-memory-cell dynamic RAM takes up more space than a comparable two-transistor-memory-cell dynamic RAM (i.e., both having 1 Mbit of storage capacity), the use of differential bit-lines for the four-transistor or six-transistor-memory-cell dynamic RAM lessens the likelihood of incorrectly reading data from the memory or writing data to the memory. That is, the use of only a single bit-line makes the sensing of the data stored in the memory-cells of the RAM much more difficult, since single-ended sensing is more susceptible to errors due to noise on the bit-lines. This is due primarily to the signal swing on the single bit-line being less than that for a four-transistor-memory-cell memory-cell or a six-transistor-memory-cell (which use two bit-lines of opposite polarity).

Figure 1A:
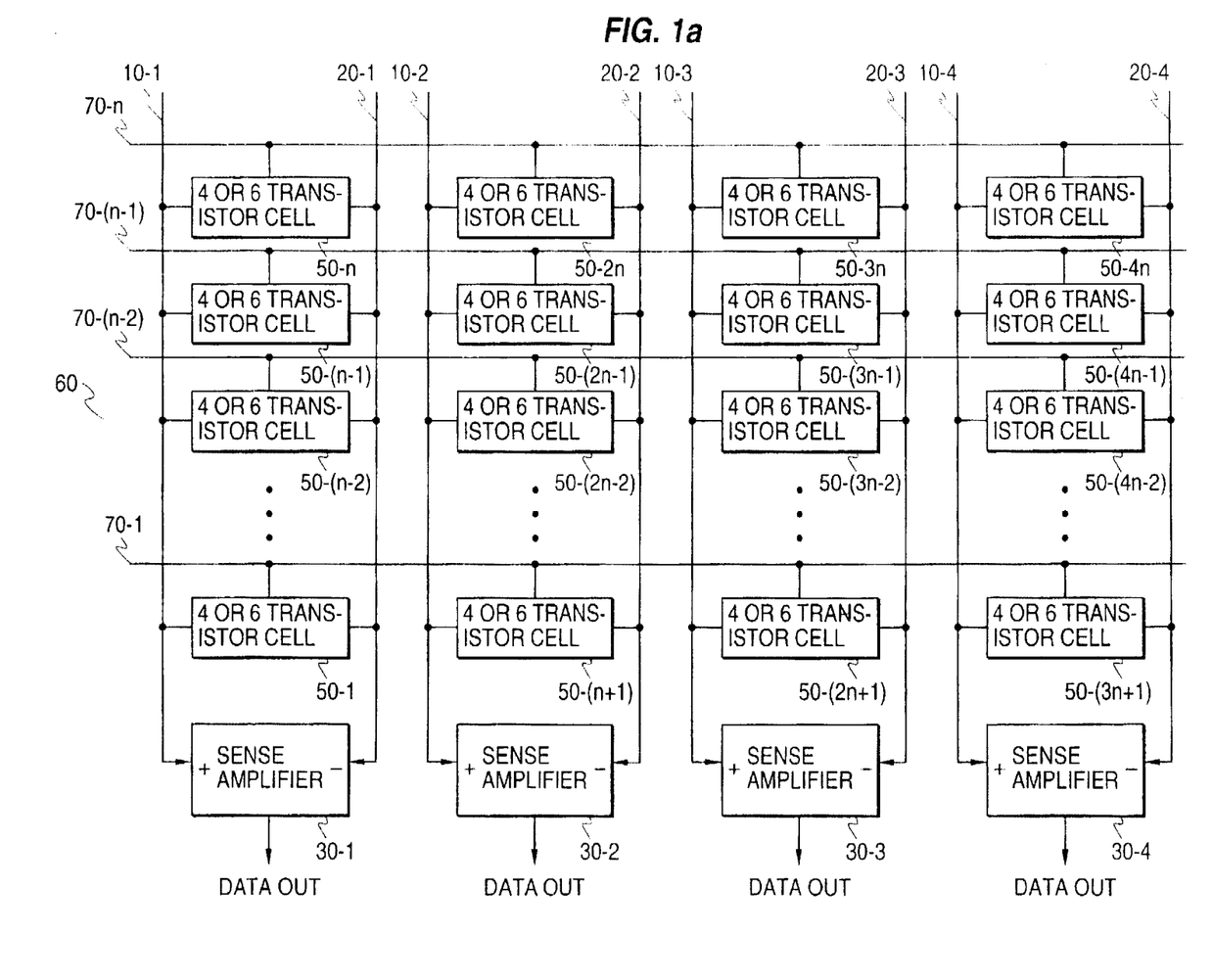
FIG. 1a shows a differential bit-line connection to a conventional four-transistor or six-transistor memory-cell dynamic RAM.

A typical differential-sensing scheme is shown in FIG. 1a, whereby BIT-line 10-1 and BIT_-line 20-1 are both connected to each of the four-transistor or six-transistor-memory-cells 50-1 to 50-n of a first column of a dynamic RAM 60, BIT-line 10-2 and BIT_-line 20-2 are both connected to each of the four-transistor or six-transistor-memory-cells 50-(n+1) to 50-2n of a second column of the dynamic RAM 60, BIT-line 10-3 and BIT_-line 20-3 are both connected to each of the four-transistor or six-transistor-memory-cells 50-(2n+1) to 50-3n of a third column of the dynamic RAM 60, and BIT-line 10-4 and BIT_-line 20-4 are both connected to each of the four-transistor or six-transistor memory cells 50-(3n+1) to 50-4n of a third column of the dynamic RAM 60. BIT-line 10-1 is input to a positive terminal of a sense-amplifier 30-1, and BIT_-line 20-1 is input to a negative terminal of the sense-amplifier 30-1. The same connections are made for BIT-lines 10-2 to 10-4, BIT_-lines 20-2 to 20-4, and sense-amplifiers 30-2 to 30-4. Based on the sensing of BIT-lines 10-1 to 10-4 and BIT_-lines 20-1 to 20-4 by sense-amplifiers 30-1 to 30-4, respectively, a determination is made as to whether a logic "1" value or a logic "0" value has been read from a particular memory-cell of dynamic RAM 60.

A particular memory-cell is read by activating one of the word-lines 70-1 to 70-n of dynamic RAM 60. Once a particular word-line, say word-line 70-2, is activated (i.e., placed in a logic "high" state), each of the memory-cells on the corresponding row of that word line are activated so as to cause the stored contents to be dumped onto the respective BIT-line and the inverted value of the stored contents to be dumped onto the respective BIT_-line for the memory-cell.

As shown in FIG. 1a, if word-line 70-1 is placed in an active "high" state, memory-cells 50-1, 50-(n+1), 50-(2n+1), and 50-(3n+1) are activated. The content memory-cell 50-1 is dumped onto BIT-line 10-1 and BIT_-line 20-1, the content of memory-cell 50-(n+1) is dumped onto BIT-line 10-2 and BIT_-line 20-2, the content of memory-cell 50-(2n+1) is dumped onto BIT-line 10-3 and BIT_-line 20-3, and the content of memory-cell 50-(3n+1) is dumped onto BIT-line 10-4 and BIT_-line 20-4.

As is known to one of ordinary skill in the art, BIT-lines 10-1 to 10-4 are precharged to a logic high value, say 5 volts, and BIT_-lines 20-1 to 20-4 are also precharged to a logic high value. If a logic high value is currently stored in memory-cell 50-1, BIT-line 10-1 remains at or close to the precharged logic high value, due to capacitive coupling and/or the charge corresponding to the logic high value in the memory cell 50-1, and BIT_-line 20-1 drops below a reference value, say 2.5 volts, due to capacitive coupling and/or the charge corresponding to a logic low value (that is, an inverted value of the charge that is also stored in memory cell 50-1) from memory-cell 50-1 pulling down BIT_-line 20-1. If a logic low value is currently stored in memory-cell 50-(n+1), then the voltage of BIT-line 10-2 drops below the reference value due to the capacitive coupling and/or the charge corresponding to the logic low value from memory cell 50-(n+1) pulling down BIT line 10-2, and the voltage of BIT_-line 20-2 remains at the precharged logic high value due to the capacitive coupling and/or charge corresponding to a logic high value (that is, an inverted value of the charge that is also stored in memory cell 50-(n+1)) from memory cell 50-(n+1) to BIT_line 20-2.

Figure 1B:
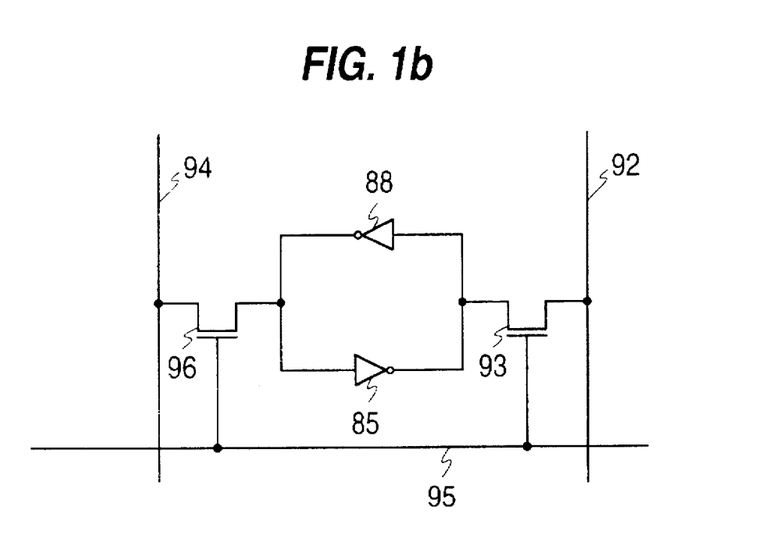
FIG. 1b shows a conventional memory cell logically implemented as a pair of inverters and transfer gates.

FIG. 1b shows a logical implementation of a conventional memory cell, with a first inverter 85 and a second inverter 88. The first inverter 85 has an output connected to an input of the second inverter 88, and the second inverter 88 has an output connected to an input of the first inverter 85. With this configuration, the output of the first inverter 85 is sent to a Bit-line 92 through a transfer gate 93 controlled by the Word-line 95, and the output of the second inverter 88 (which is the logical inversion of the output of the first inverter 85) is sent to a Bit_-line 94 through a transfer gate 96 that is also controlled by the Word-line 95.

Referring back to FIG. 1a, sense-amplifiers 30-1 to 30-4 input the corresponding BIT-lines 10-1 to 10-4 and BIT_-lines 20-1 to 20-4 (and their respective voltages) in order to determine the contents of the read-out memory-cells 50-1, 50-(n+1), 50-(2n+1), and 50-(3n+1).

Figure 2:
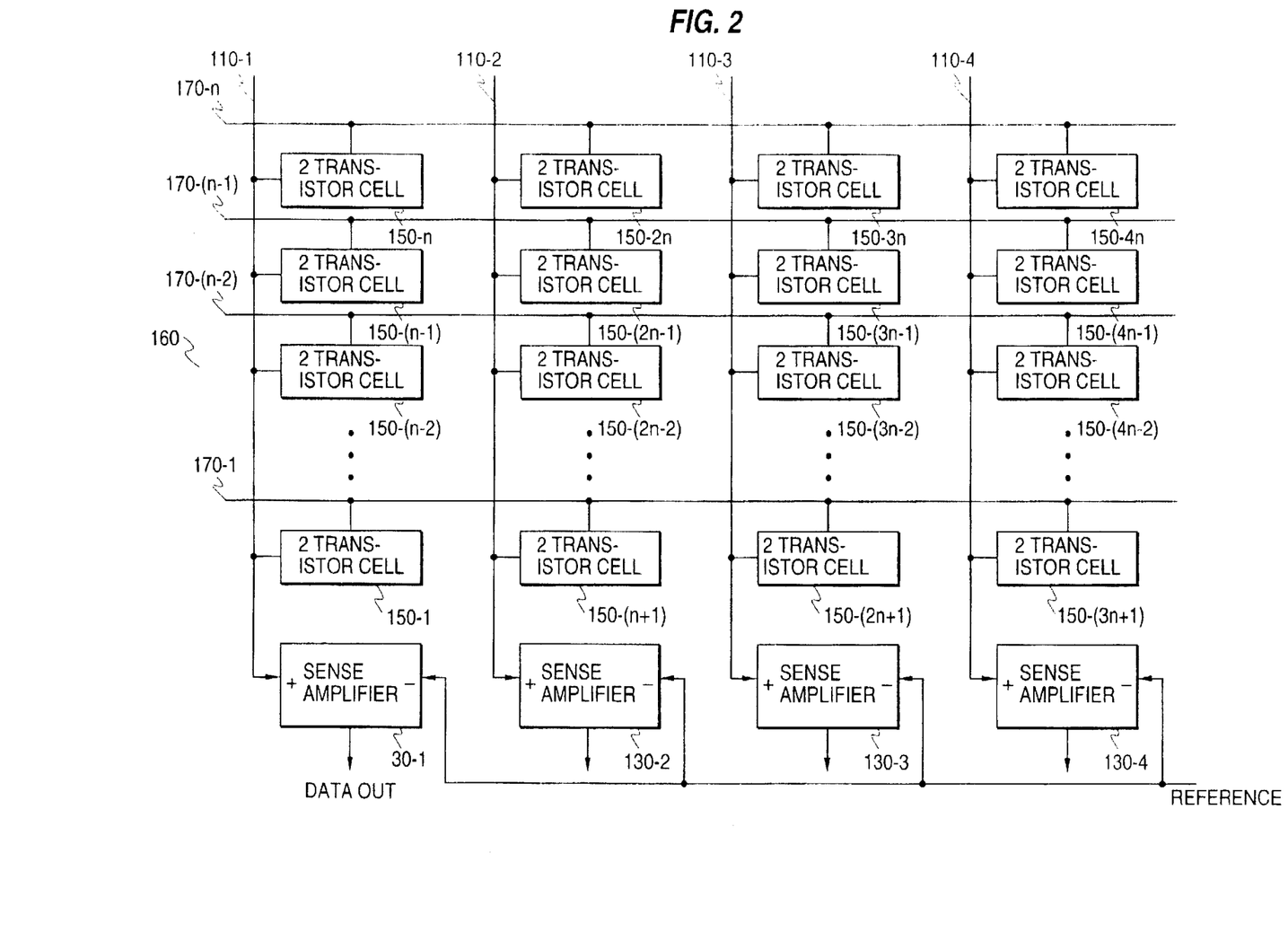
FIG. 2 shows a single bit-line connection to a conventional two-transistor-memory-cell dynamic RAM.

A typical single-bit sensing scheme for a two-transistor-memory-cell RAM is shown in FIG. 2, whereby BIT-line 110-1 is connected to each of the two-transistor-memory-cells 150-1 to 150-n of a first column of a dynamic RAM 160, BIT-line 110-2 is connected to each of the two-transistor-memory-cells 150-(n+1) to 150-2n of a second column of dynamic RAM 160, BIT-line 110-3 is connected to each of the two-transistor-memory-cells 150-(2n+1) to 150-3n of a third column of dynamic RAM 160, and BIT-line 110-4 is connected to each of the two-transistor-memory-cells 150-(3n+1) to 150-4n of a fourth column of dynamic RAM 160. BIT-line 110-1 is input to a positive terminal of a sense-amplifier 130-1, and a negative terminal of the sense-amplifier 130-1 receives a reference voltage, such as 2.5 volts (or typically about half-way between a maximum possible voltage and a minimum possible voltage on BIT-line 110-1). In the same fashion, sense-amplifiers 130-2 to 130-4 are respectively connected to BIT-lines 110-2 to 110-4, and each sense-amplifier is also connected to the reference voltage.

With the conventional two-transistor-memory-cell dynamic RAM, while it may provide a smaller size due to the use of only two transistors for each memory-cell, there is a problem in that noise may cause incorrect reading of the contents of the memory-cells. Also, with the conventional four-transistor or six-transistor-memory-cell dynamic RAM, while it may provide for fairly accurate reading of the contents of the memory-cells due to the use of differential bit-lines, such four-transistor or six-transistor memories take up more space on a silicon substrate.

SUMMARY OF THE INVENTION

It is an object of the invention to provide a two-transistor-memory-cell dynamic RAM which is more immune to noise than conventional two-transistor-memory-cell dynamic RAMs.

It is also an object of the invention to provide a layout of a two-transistor-memory-cell dynamic RAM which is not substantially affected by power lines provided on the same chip for the dynamic RAM.

These and other objects and advantages of the invention are achieved by a dynamic RAM, which includes a first group of memory cells including a first dummy-memory-cell. The dynamic RAM also includes a second group of memory-cells including a second dummy-memory-cell. The dynamic RAM further includes a sense-amplifier having a first input connected to the first group of memory-cells and having a second input connected to the second group of memory-cells. When a read-request is made to a memory-cell within the first group of memory-cells, the second dummy-memory-cell is activated so as to cause an output from the requested memory-cell within the first group of memory-cells to be sent to the first input of the sense-amplifier and an output of the second dummy-memory-cell to be sent to the second input of the sense-amplifier. When a read-request is made to a memory-cell within the second group of memory-cells, the first dummy-memory-cell is activated so as to cause an output from the requested memory cell within the second group of memory-cells to be sent to the second input of the sense-amplifier and an output of the first dummy-memory-cell to be sent to the first input of the sense-amplifier.

The above-mentioned objects and other advantages are also achieved by a dynamic RAM, which includes a first group of memory-cells arranged in a matrix form having a plurality of rows and columns, the first group of memory-cells including a row of first dummy-memory-cells. The dynamic RAM also includes a first set of bit-lines respectively coupled on a one-to-one basis to the columns of the first group of memory-cells. The dynamic RAM further includes a first set of word-lines respectively coupled on a one-to-one basis to the rows of the first group of memory-cells. The dynamic RAM still further includes a second group of memory-cells arranged in a matrix form having a plurality of rows and columns, the second group of memory-cells including a row of second dummy-memory-cells. The dynamic RAM includes a second set of bit-lines respectively coupled on a one-to-one basis to the columns of the second group of memory-cells. The dynamic RAM also includes a plurality of sense-amplifiers provided on a one-to-one basis for the columns of the first and second groups of memory-cells, each of the plurality of sense-amplifiers having a first input connected to receive a corresponding one of the first set of bit-lines, and having a second input connected to receive a corresponding one of the second set of bit-lines. When a read-request is made to a memory-cell within the first group of memory-cells, the second group of dummy-memory-cells are outputted to the sense-amplifiers by activation of the corresponding word-line for the second group of memory-cells, so as to cause an output from the requested memory-cell within the first group of memory-cells to be sent to the first input of the corresponding one of the sense amplifiers and an output of the second group of dummy-memory-cells to be sent to the second input of the corresponding one of the sense-amplifiers. When a read-request is made to a memory-cell within the second group of memory-cells, the first group of dummy-memory-cells are outputted to the sense-amplifiers by activation of the corresponding word-line for the first group of memory-cells, so as to cause an output from the requested memory-cell within the second group of memory-cells to be sent to the second input of the corresponding one of the sense-amplifiers and an output of the first group of dummy-memory-cells to be sent to the first input of the corresponding one of the sense-amplifiers.

The above-mentioned objects and other advantages are also achieved by a method of reading data from a dynamic RAM, the dynamic RAM including a sense-amplifier for outputting data. The method includes a step of partitioning the dynamic RAM into a first group of memory-cells and a second group of memory-cells, the first group of memory-cells including at least a first dummy-memory-cell and the second group of memory-cells including at least a second dummy-memory-cell. Upon receipt of a read-request to one of the first group of memory-cells, the method includes the step of activating the second dummy-memory-cell so that contents of the requested one of the first group of memory-cells and contents of the second dummy-memory-cell are sent to the sense-amplifier at the same time. Upon receipt of a read-request to one of the second group of memory-cells, the method includes the step of activating the first dummy-memory-cell so that contents of the requested one of the second group of memory-cells and contents of the first dummy-memory-cell are sent to the sense-amplifier at the same time.

BRIEF DESCRIPTION OF THE DRAWINGS

These and other objects and advantages of the invention will become more fully apparent from the following detailed description when read in conjunction with the accompanying drawings with like reference numerals indicating corresponding parts throughout, and wherein.

DETAILED DESCRIPTION OF THE PREFERRED EMBODIMENTS

Figure 3A:
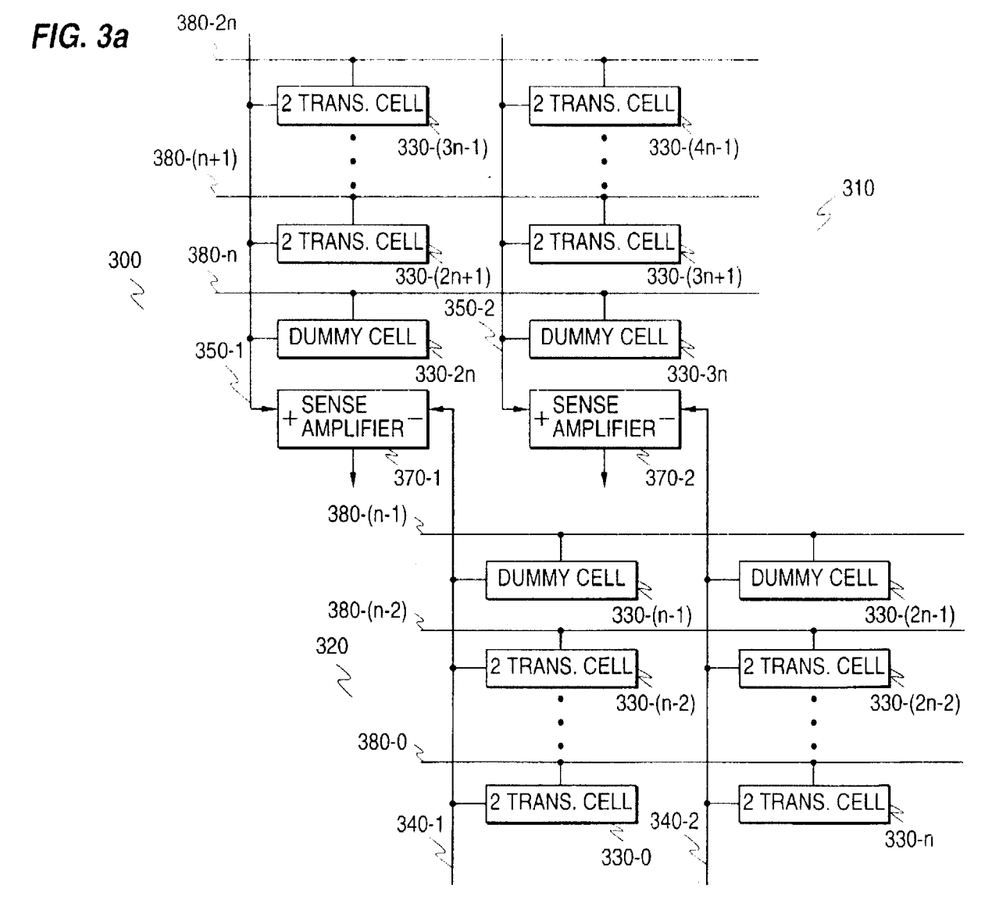
FIG. 3a shows a two-transistor-memory-cell dynamic RAM according to a first embodiment of the invention.

Preferred embodiments of the invention will be described hereinbelow with reference to FIGS. 3 through 8. FIG. 3a shows a two-transistor-memory-cell dynamic RAM 300 according to a first embodiment of the invention. In FIG. 3a, dynamic RAM 300 is divided into first-half (or first array) 310 and a second-half (or second array) 320, whereby the second-half 320 includes memory-cells 330-0 to 330-(2n−1), and the first-half 310 includes memory-cells 330-2n to 330-(4n−1). In FIG. 3a, for ease in explanation, the first-half 310 and the second-half 320 are each shown having two columns and n rows, although one of ordinary skill in the art will recognize that the first-half 310 and the second-half 320 can have any number of columns and rows, with each column having its own bit-line and its own sense-amplifier, and with each row having its own word-line.

The memory-cells 330-0 to 330-(n−1) of the first column of the second-half 320 of dynamic RAM 300 are connected to a Bit_Minus-line 340-1, and the memory-cells 330-n to 330-(2n−1) of the second column of the second-half 320 of dynamic RAM 300 are connected to a Bit_Minus-line 340-2. Bit_Minus-line 340-1 is connected to a Minus Input of Sense-Amplifier 370-1, and Bit_Minus-line 340-2 is connected to a Minus Input of Sense-Amplifier 370-2.

The memory-cells 330-2n to 330-(3n−1) of the first column of the first-half 310 of dynamic RAM 300 are connected to a Bit_Plus-line 350-1, and the memory-cells 330-3n to 330-(4n−1) of the second column of the first-half 310 of dynamic RAM 300 are connected to a Bit-Plus-line 350-2. Bit_Plus-line 350-1 is connected to a Plus Input of Sense-Amplifier 370-1, and Bit_Plus-line 350-2 is connected to a Plus Input of Sense-Amplifier 370-2.

In FIG. 3a, one row of the first-half 310 includes only dummy-memory-cells 330-2n and 330-3n, while one row of the second-half 320 includes only dummy-memory-cells 330-(n−1) and 330-(2n−1). An exemplary configuration of each dummy-memory-cell is shown in FIG. 4, and an exemplary configuration of each two-transistor-memory-cell is shown in FIG. 5.

In FIG. 3a, dummy-memory-cell 330-(n−1) is connected to a Word-line 380-(n−1), and dummy-memory-cell 330-(n−1) is also connected to Bit-Minus-line 340-1. Dummy-memory-cell 330-(2n−1) is connected to Word-line 380-(n−1), and dummy-memory-cell 330-(2n−1) is connected to Bit-Minus-line 340-2. Dummy-memory-cell 330-2n is connected to Word-line 380-n, and dummy-memory-cell 330-2n is also connected to Bit-Plus-line 350-1. Dummy-memory-cell 330-3n is connected to Word-line 380-n, and dummy-memory-cell 330-3n is connected to Bit-Plus-line 350-2.

Figure 4:
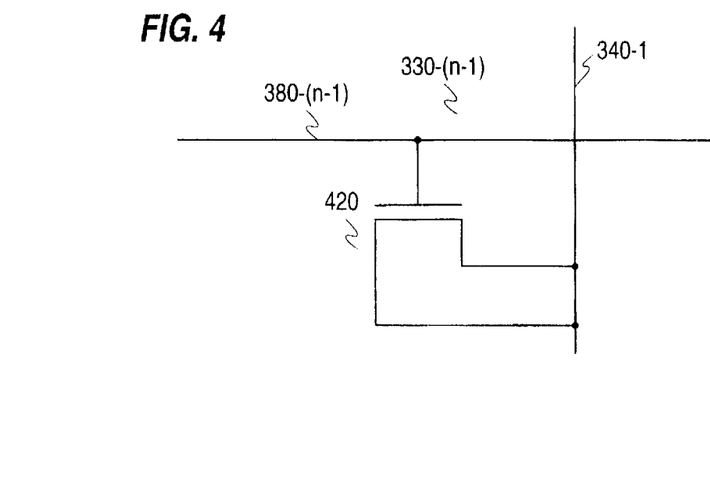
FIG. 4 shows a dummy cell that can be utilized with the two-transistor-memory-cell dynamic RAM according to the preferred embodiment of the invention.
Figure 5:
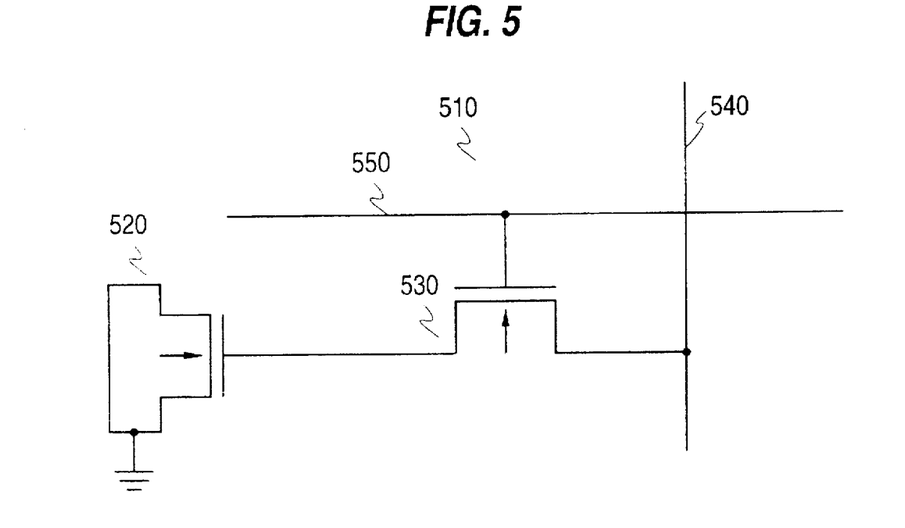
FIG. 5 shows a two-transistor-memory-cell that can be utilized with the two-transistor-memory-cell dynamic RAM according to the preferred embodiment of the invention.

Each of the dummy-memory-cells includes a transistor, such as transistor 420 for dummy-memory-cell 330-(n−1) as shown in FIG. 4. A gate of transistor 420 for dummy-memory-cell 330-(n−1) is connected to word-line 380-(n−1), and both a source and a drain of transistor 420 are connected to Bit_Minus-line 340-1. By this configuration of a dummy-memory-cell, when the word-line for the dummy-memory-cell is activated (i.e., placed in an active "high" state), a small amount of charge from the word-line 380-(n−1) is transferred to the Bit_Minus-line 340-1 due to the transistor 420 turning on and due to the gate capacitance of the turned-on transistor 420. This causes the Bit_Minus-line 340-1 to remain close to its precharged value. A similar configuration exists for the other dummy-memory-cells, whereby the dummy-memory-cells in the first half 310 are coupled to a Bit_Plus-line instead of a Bit_Minus-line, as well as being coupled to a different word line. The dummy-memory-cells in the first-half 310 are coupled to Word-line 380-n, and the dummy-memory-cells in the second-half 320 are coupled to Word-line 380-(n−1).

In the system according to the invention, when any of the two-transistor-memory-cells in the first-half 310 are selected for reading therefrom, the dummy-memory-cells in the second-half 320 are also selected. Also when any of the two-transistor-memory-cells in the second-half 320 are selected for reading therefrom, the dummy-memory-cells in the first-half 310 are also selected. Thus, according to the invention, a pseudo dual-bit line architecture is achieved for a two-transistor-memory-cell dynamic RAM, whereby the sense-amplifiers of the dynamic RAM receive a pair of differential bit-lines in order to lessen the effects of noise, which might otherwise cause an incorrect reading of the contents of the RAM.

Figure 6A:
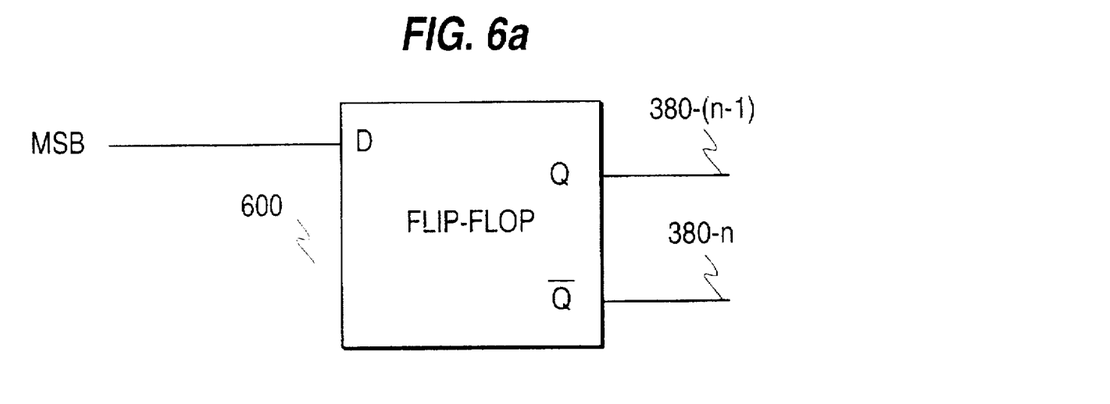
FIGS. 6a, 6b and 6c show different types of activation circuits that can be utilized with the two-transistor-memory-cell dynamic RAM according to the first embodiment of the invention.
Figure 6B:
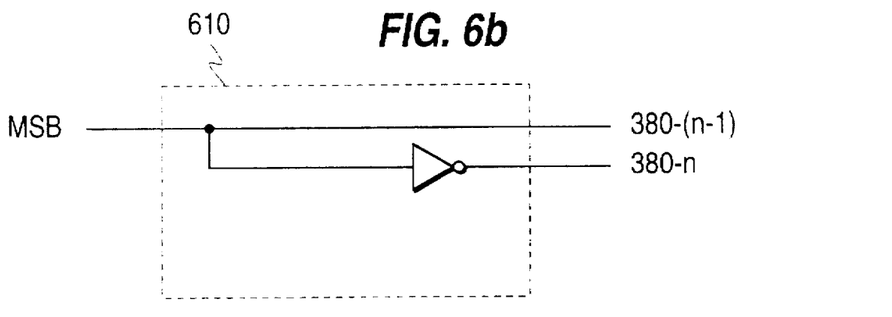
Figure 6C:
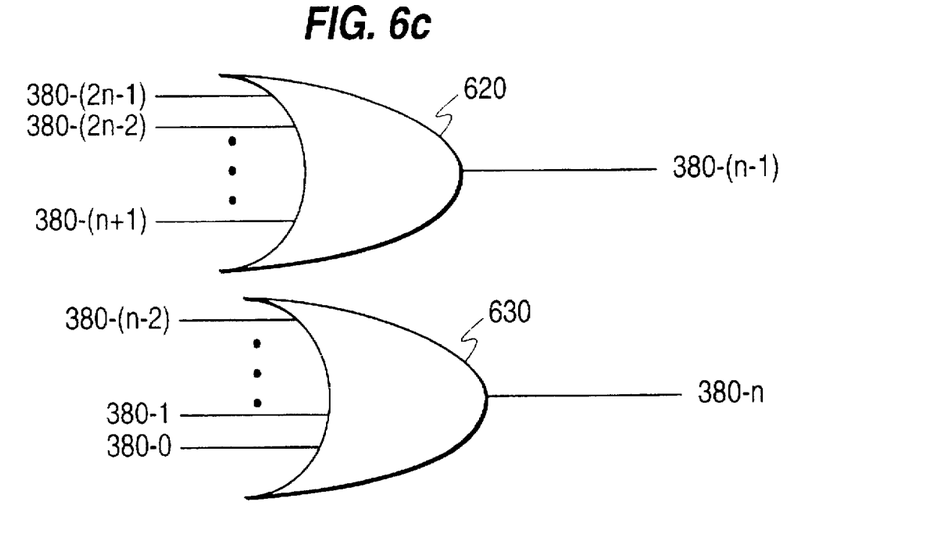

When data is accessed from the first-half 310 of the dynamic RAM 300, the dummy-word-line 380-(n−1) on the second-half 320 of dynamic RAM 300 is activated. When data is accessed from the second-half 320 of dynamic RAM 300, the dummy-word-line 380-n on the first-half 310 of the dynamic RAM 300 is activated. This way, the only charge imbalance between the BIT_Plus-line and the Bit_Minus-line is due to the information stored in the memory-cell being read. An exemplary device for activating the dummy-word-line on the opposite half of the dynamic RAM 300 when reading a memory-cell in the other half of the dynamic RAM 300 is shown in FIG. 6a, whereby the most significant bit (MSB) of the memory address (used to access the correct word-line) is utilized to activate the corresponding dummy-word-line (i.e., either the dummy-word-line for the first-half 310 or the dummy-word-line for the second-half 320).

For example, the dynamic RAM 300 can be configured such that a memory address having an MSB of "1" means that a memory-cell in the first-half 310 of dynamic RAM 300 is being accessed. Activation Circuit 600 receives an MSB of a memory address of "1", which will cause activation of the dummy-word-line 380-(n−1) in the second-half 320 of dynamic RAM 300. A memory address having an MSB of "0" means that a memory-cell in the second-half 320 of dynamic RAM 300 is being accessed. In that situation, Activation Circuit 600 receives an MSB (of a memory address) of "0", which will cause activation of the dummy-word-line 380-n in the first-half 310 of dynamic RAM 300. A simple asynchronous D-type flip-flop can be utilized as the Activation Circuit 600, whereby the MSB of the memory address is input to the D-input, the Q-output is connected to dummy-word-line 380-(n−1) of second-half 320 of dynamic RAM 300, and the Q-bar-output is connected to dummy-word-line 380-n of the first-half 310 of dynamic RAM 300. Other types of configurations of the Activation Circuit can be envisioned by one of ordinary skill in the art, such as those shown in FIGS. 6b and 6c for example, while remaining within the teachings of the invention as described herein.

FIG. 5 shows a two-transistor-memory-cell 510 that can be utilized in the system according to the invention. In FIG. 5, there is shown a first transistor 520, which acts as a storage device for storing the contents of the memory-cell. The first transistor 520 is shown as a field effect transistor (FET), with the source and the drain of the first transistor 520 connected to ground. The gate of the first transistor 520 is connected to a source of a second transistor 530. The second transistor 530 serves as a pass transistor for the memory cell 510. The drain of second transistor 530 is connected to a Bit-Line 540 (which corresponds to either the Bit_Plus-line or the Bit_Minus-line, depending upon whether the memory-cell 510 is in the first-half 310 or the second-half 320 of dynamic RAM 300), and the gate of second transistor 530 is connected to a Word-Line 550 (which corresponds to the word-line for the row in which the memory-cell 510 is situated). Note that each dummy-memory-cell has only one transistor, as seen in FIG. 4, whereby that transistor 410 serves as a pass transistor. Thus, there is no storage device in the dummy-memory-cells.

In the preferred embodiments, the first transistor 520 has a channel width of 9.9 microns and a channel length of 3 microns, and the second transistor 630 has a channel width of 3.2 microns and a channel length of 1.6 microns. These values are given as typical values for the transistors of a two-transistor-memory-cell, and other channel length and width values may be utilized for the transistors of a two-transistor-memory-cell and still remain within the teachings of the invention as given herein. In any event, the size and characteristics of the pass transistor for the two-transistor-memory-cell are preferably the same as the size and characteristics of the single transistor within the dummy-memory-cell.

Figure 3B:
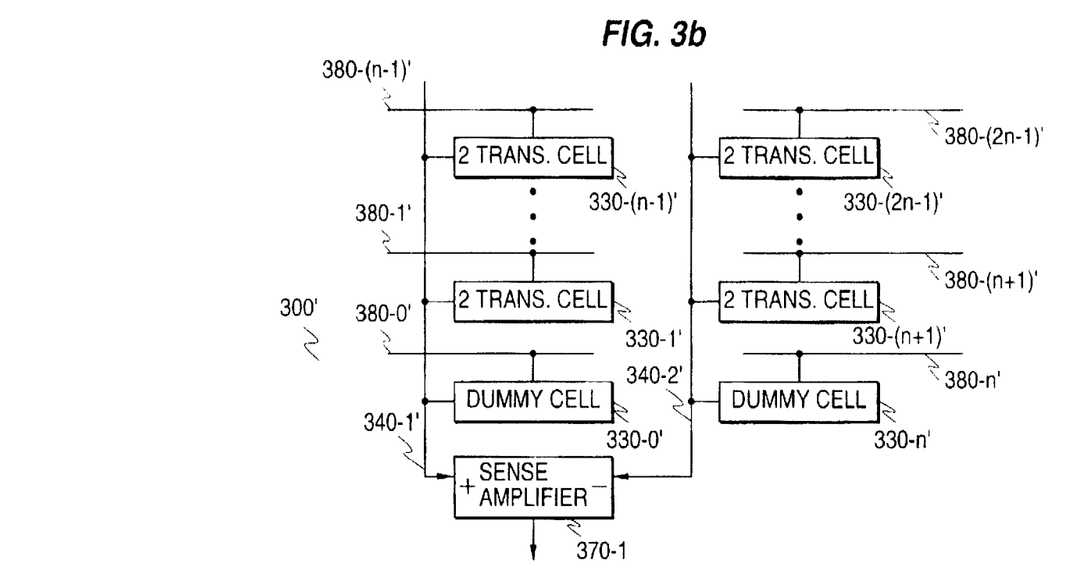
FIG. 3b shows a two-transistor-memory-cell dynamic RAM according to a second embodiment of the invention.

A second embodiment of the invention is shown in FIG. 3b, whereby the dynamic RAM 300' is not divided up into two halves, but rather alternate columns of dynamic RAM 300' are respectively input to either "+" or "−" inputs of sense-amplifiers. By this configuration, when a memory-cell in a particular column is accessed for a read therefrom, a dummy-memory-cell in an adjacent column is also accessed. For example, referring now to FIG. 3b, if memory-cell 330-(n−1)' is accessed for a read by virtue of activating word-line 380-(n−1)' and bit-line 340-1', then the dummy-memory-cell 330-n' in the adjacent column is also activated by virtue of activating word-line 380-n' and bit-line 340-2'. The output from memory-cell 330-(n−1)' is sent to the "+" input of sense-amplifier 370-1', and the output from dummy-memory-cell 330-n' is sent to the "−" input of sense-amplifier 370-1'.

Figure 7:
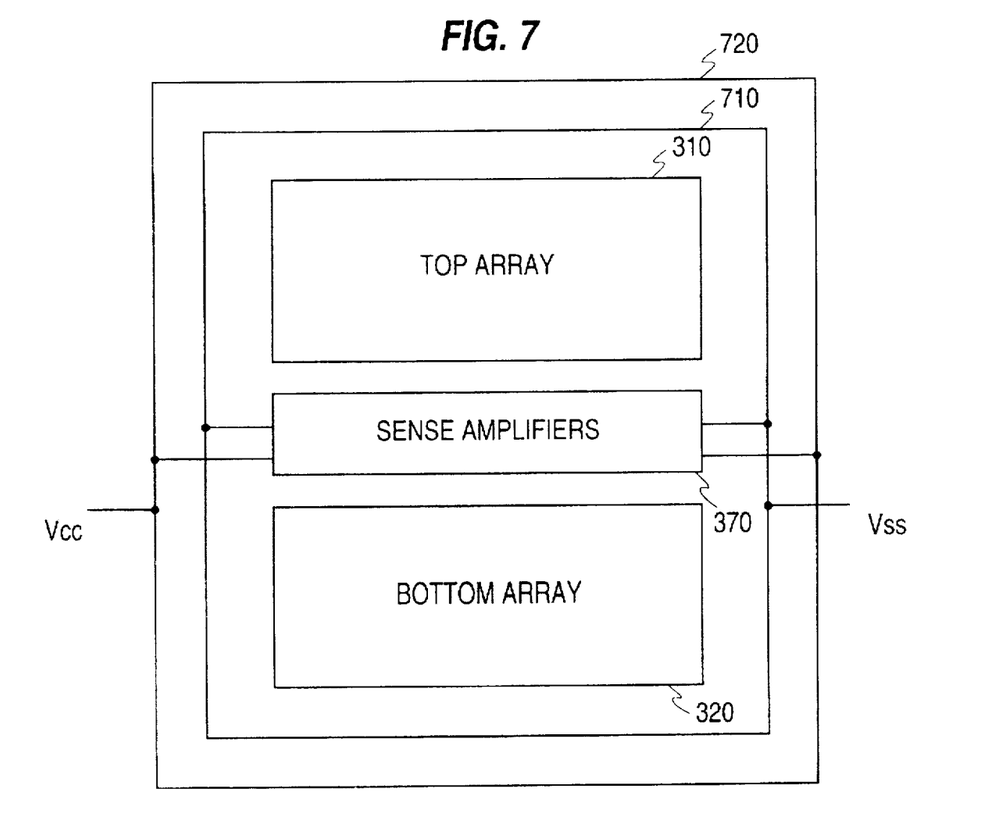
FIG. 7 shows a layout of power lines with respect to a bottom half and a top half of a two-transistor-memory-cell dynamic RAM according to the first embodiment of the invention.

An exemplary topology of the two-transistor-memory-cell dynamic RAM 300 according to the first embodiment is shown in FIG. 7, whereby the sense-amplifiers 370 are disposed between memory-cells of the first-half 310 and the memory-cells of the second-half 320 of dynamic RAM 300. The first-half 310 is positioned as a top array (or matrix) and the second-half 320 is positioned as a bottom array (or matrix). The positions may be reversed. Dynamic RAM 300 may also be configured as left and right halves instead of top and bottom halves.

Since the memory array of dynamic RAM 300 is split into two halves 310 and 320 in the first embodiment, and since the two halves 310 and 320 are physically separated, the power supply buses in the RAM 300 need to, be designed such that noise on the incoming power lines does not affect the top array 310 of dynamic RAM 300 differently from the bottom array 320 of dynamic RAM 300.

A high-potential voltage Vcc (i.e., 5 volts) is applied via high-potential voltage lines 720 to sense-amplifiers 370, in a manner whereby voltage lines 720 extend along the periphery of the top array 310 and the bottom array 320 of dynamic RAM 300. Similarly, a low-potential voltage Vss (i.e., −5 volts) is applied via low-potential voltage lines 710 to sense-amplifiers 370, in a manner similar to the layout of the high-potential voltage lines 720. That is, high-potential voltage lines 720 and low-potential voltage lines 710 are disposed in an arrangement such that they both extend around the periphery of the top-array 310 and the bottom-array 320 of dynamic RAM 300, with the lines 710 and 720 following a similar but slightly offset track with respect to each other. As can be readily seen from FIG. 7, the layout of the lines 710 and 720 are very similar, with the lines 710 being closer to the top-array 310 and bottom-array 320 than the lines 720. Alternatively, the lines 720 may be placed closer to the top-array 310 and the bottom-array 320 than the lines 710.

Figure 8:
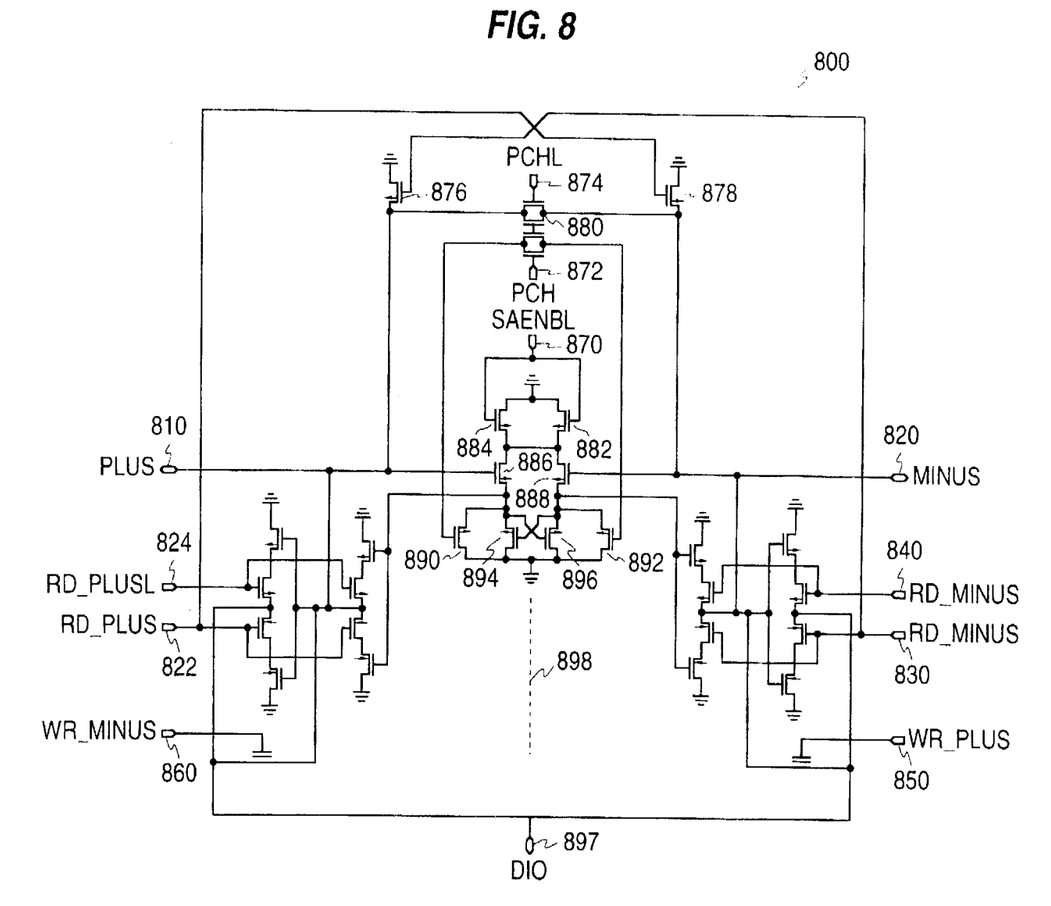
FIG. 8 shows a sense-amplifier that can be utilized with the two-transistor-memory-cell dynamic RAM according to the first or second embodiments of the invention.

An exemplary sense amplifier that can be utilized in the system according to the invention is shown in FIG. 8. Sense-Amplifier 800 has a Plus input 810 which receives the inputs from the Bit_Plus-lines of the first-half 310 of dynamic RAM 300, and a Minus input 820 which receives the inputs from the Bit_Minus-lines of the second-half 320 of dynamic RAM 300. RD_Plus 822 and RD_Plus_L 824 are complementary read signals used to cause a read to a memory-cell in the first-half 310 of dynamic RAM 300, and RD_Minus 830 and RD_Minus_L 840 are complementary read signals used to cause a read to a memory-cell in the second-half 320 of dynamic RAM 300. WR_Plus 850 is a signal used to cause a write to a memory-cell in the first-half 310 of dynamic RAM 300, and WR_Minus 860 is a signal used to cause a write to a memory-cell in the second-half 320 of dynamic RAM 300. Each of these signals is output from a processor (not shown), which initiates the read or write request.

Sense-amplifier 800 also receives a sense-amplifier enable signal SAENBL 870, which enables sense-amplifier 800 when in a logic "1" state. PCH 872 and PCH_ 874 are precharging signals used to precharge the bit-lines Bit_Plus and Bit_Minus to a logic high value. After PCH 872 and PCH_ 874 have precharged the bit-lines, these signals are deactivated, and SAENBL 870 is activated, so that sense-amplifier 800 can then sense differences between the Bit_Plus and Bit_Minus lines.

Sense-amplifier 800 includes a first transistor 876, a second transistor 878, a transmission gate 880, which are used in precharging the bit-lines. Sense-amplifier 800 also includes a third transistor 882 and a fourth transistor 884, which are used to enable sense-amplifier 800 when SAENBL 870 is placed into an active high state. Sense-amplifier 800 further includes a fifth transistor 886 and a sixth transistor 888, whose gates are respectively connected to the Bit_Plus and Bit_Minus lines. Sense-amplifier 800 still further includes a seventh transistor 890, an eighth transistor 892, and a pair of cross-coupled, ninth and tenth transistors 894 and 896. Cross-coupled transistors 894 and 896 are used to drive information received by the sense-amplifier 800 onto a data I/O bus DI/O 897.

Also shown in FIG. 8 is a dashed line 898 which bisects the sense-amplifier 800 along a widthwise direction, whereby both the first-half 310 and the second-half 320 are preferably arranged to be symmetrical about the line 898. This feature reduces problems due to noise for dynamic RAM 300.

While a preferred embodiment has been described herein, modification of the described embodiment may become apparent to those of ordinary skill in the art, following the teachings of the invention, without departing from the scope of the invention as set forth in the appended claims.

For example, while the memory-cells of the dynamic RAM are shown as being FETs, other types of transistors, such as bipolar junction (BJT) transistors, emitter coupled logic (ECL) transistors, or complementary metal oxide semiconductor (CMOS) transistors may be utilized for the dummy-memory-cells and the two-transistor-memory-cells, while remaining within the teachings of the invention. Also, although the first embodiment was described whereby the first-half 310 included memory addresses greater than or equal to 2n and the second-half 320 included memory address less than 2n, other ways of dividing up the memory into two parts can be envisioned by one of ordinary skill in the art, while remaining within the teachings of the invention. These other ways of dividing up the memory into two parts may require a more complex Activation Circuit than those shown in FIGS. 6a–6d, however, which detect when a memory read request is made to a particular one of the two parts of the memory (so as to activate the dummy memory cells in the other part of memory).

Furthermore, although the dummy-memory-cells were shown in FIG. 3a as being disposed closer to the sense-amplifiers than the two-transistor-memory-cells in their respective arrays 310, 320, the dummy-memory-cells can alternatively be disposed in any row of the respective arrays 310, 320, such as a middle row in each array.

What is claimed is:

1. A dynamic random access memory (RAM), comprising:
   a first group of memory cells including a first dummy memory cell;
   a second group of memory cells including a second dummy memory cell; and
   a sense amplifier having a first input connected to the first group of memory cells and having a second input connected to the second group of memory cells,
   wherein when a read request is made to a memory cell within the first group of memory cells, the second dummy memory cell is activated, and an output from the requested memory cell within the first group of memory cells is provided to the first input of the sense amplifier and an output of the second dummy memory cell is provided to the second input of the sense amplifier, and
   wherein when a read request is made to a memory cell within the second group of memory cells, the first dummy memory cell is activated, and an output from the requested memory cell within the second group of memory cells is provided to the second input of the sense amplifier and an output of the first dummy memory cell is provided to the first input of the sense amplifier.

2. The dynamic RAM as recited in claim 1, wherein the sense amplifier is disposed between the first and second groups of memory cells.

3. The dynamic RAM as recited in claim 2, wherein the first group of memory cells are disposed within a first area on a silicon substrate, the second group of memory cells are disposed within a second area on the silicon substrate, the sense amplifier is disclosed within a third area on the silicon substrate, and
   wherein the third area is centrally located the first and second areas.

4. The dynamic RAM as recited in claim 1, wherein each of the memory cells of the first and second groups of memory cells are two-transistor memory cells, and
   wherein each of the first and second dummy memory cells includes a single-transistor configured as a pass-through transistor.

5. The dynamic RAM as recited in claim 4, wherein the two-transistor memory cells include a first transistor for storing information, and a second transistor for passing through the stored information to the sense amplifier.

6. The dynamic RAM as recited in claim 1, further comprising:
   a first power line connected to the sense amplifier for supplying a first voltage to the sense amplifier; and
   a second power line connected to the sense amplifier for supplying a second voltage to the sense amplifier,
   wherein the second voltage is greater than the first voltage, and
   wherein the first and second power lines are disposed along a periphery of the first and second groups of memory cells.

7. The dynamic RAM as recited in claim 6, wherein the first power lines are located closer to the first and second groups of memory cells than the second power lines.

8. The dynamic RAM as recited in claim 6, wherein the first power lines are located farther from the first and second groups of memory cells than the second power lines.

9. A dynamic random access memory (RAM), comprising:
   a first group of memory cells arranged in a form having a plurality of rows and columns, the first group of memory cells including a row of first dummy memory cells;
   a first set of bit lines respectively knelt on a one-to-one basis to the columns of the first group of memory cells;
   a first set of word lines respectively coupled on a one-to-one basis to the rows of the first group of memory cells;
   a second group of memory cells arranged in a matrix form having a plurality of rows and columns, the second group of memory cells including a row of second dummy memory cells;
   a second set of bit lines respectively coupled on a one-to-one basis to the columns of the second group of memory cells;
   a second set of word lines respectively coupled on a one-to-one basis to the rows of the second group of memory cells;
   a plurality of sense amplifiers provided on a one-to-one basis for the columns of the first and second groups of memory cells, each of the plurality of sense amplifiers having a first input connected to receive a corresponding one of the first set of bit lines, and having a second input connected to receive a corresponding one of the second set of bit lines,
   wherein when a read request is made to a memory cell within the first group of memory cells, the second group of dummy memory cells are outputted to the sense amplifiers by activation of a corresponding one of the second set of word lines for the second group of memory cells, and an output from the requested memory cell within the first group of memory cells is provided to the first input of the corresponding one of the sense amplifiers and an output of the second group of dummy memory cells is provided to the second input of the corresponding one of the sense amplifiers, and
   wherein when a read request is made to a memory cell within the second group of memory cells, the first group of dummy memory cells are outputted to the sense amplifiers by activation of a corresponding one of the first set of word lines for the first group of memory cells, and an output from the requested memory cell within the second group of memory cells is provided to the second input of the corresponding one of the sense amplifiers and an output of the first group of dummy memory cells is provided to the first input of the corresponding one of the sense amplifiers.

10. The dynamic RAM as recited in claim 9, wherein the sense amplifiers are disposed between the first and second groups of memory cells.

11. The dynamic RAM as recited in claim 10, wherein the first group of memory cells are disposed within a first area on a silicon substrate, the second group of memory cells are disposed within a second area on the silicon substrate, the sense amplifiers are disposed within a third area on the silicon substrate, and wherein the third area is centrally located between the first and second areas.

12. The dynamic RAM as recited in claim 9, wherein each of the memory cells of the first and second groups of memory cells are two-transistor memory cells, and wherein each of the first and second groups of dummy memory cells includes a single-transistor which acts as a pass-through transistor.

13. The dynamic RAM as recited in claim 12, wherein each of the two-transistor memory cells includes a first transistor for storing information, and a second transistor for passing through the stored information to the sense amplifier.

14. The dynamic RAM as recited in claim 9, further comprising:

a first power line connected to the sense amplifier for supplying a first voltage to the sense amplifier; and a second power line connected to the sense amplifier for supplying a second voltage to the sense amplifier, wherein the second voltage is greater than the first voltage, and wherein the first and second power lines are disposed along a periphery of the first and second groups of memory cells.

15. The dynamic RAM as recited in claim 14, wherein the first power lines are located closer to the first and second groups of memory cells than the second power lines.

16. The dynamic RAM as recited in claim 14, wherein first power lines are located farther from the first and second groups of memory cells than the second power lines.

17. A method of reading data from a dynamic random access memory (RAM), the dynamic RAM including a sense amplifier for outputting data, the method comprising the steps of:

a) partitioning the dynamic RAM into a first group of memory cells and a second group of memory cells, the first group of memory cells including at least a first dummy memory cell and the second group of memory cells including at least a second dummy memory cell;

b) upon receipt of a read request to one of the first group of memory cells, activating the second dummy memory cell so that contents of the requested one of the first group of memory cells and an output of the second dummy memory cell are sent to the sense amplifier at the same time; and c) upon receipt of a read request to one of the second group of memory cells, activating the first dummy memory cell so that contents of the requested one of the second group of memory cells and an output of the first dummy memory cell are sent to the sense amplifier at the same time.

18. The method as recited in claim 17, wherein the sense amplifier is disposed between the first and second groups of memory cells.

19. The method as recited in claim 18, wherein the first group of memory cells are disposed within a first area on a silicon substrate, the second group of memory cells are disposed within a second area on the silicon substrate, the sense amplifier is disposed within a third area on the silicon substrate, and wherein the third area is centrally located between the first and second areas.

20. The method as recited in claim 17, wherein each of the memory cells of the first and second groups of memory cells are two-transistor memory cells, and wherein each of the first and second dummy memory cells includes a single-transistor which is configured as a pass-through transistor.

* * * * *